(12) United States Patent  
Fuji et al.

(10) Patent No.: US 7,692,979 B2  
(45) Date of Patent: Apr. 6, 2010

(54) MEMORY READOUT CIRCUIT AND PHASE-CHANGE MEMORY DEVICE

(75) Inventors: Yukio Fuji, Tokyo (JP); Yasuko Tonomura, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 19 days.

(21) Appl. No.: 11/943,608

(22) Filed: Nov. 21, 2007

(65) Prior Publication Data

US 2008/0117669 A1     May 22, 2008

(30) Foreign Application Priority Data

Nov. 21, 2006   (JP)  ............................. 2006-314215

(51) Int. Cl.  
    *G11C 7/22*     (2006.01)
(52) U.S. Cl. ............................ 365/189.15; 365/189.14; 365/196; 365/207; 365/189.09
(58) Field of Classification Search ............ 365/189.14, 365/189.15, 196, 207, 189.09  
See application file for complete search history.

(56) References Cited

U.S. PATENT DOCUMENTS

2006/0221678 A1* 10/2006 Bedeschi et al. ............ 365/163  
2006/0233019 A1* 10/2006 Kostylev et al. ............. 365/163  
2007/0019465 A1* 1/2007 Bedeschi et al. ............ 365/163

FOREIGN PATENT DOCUMENTS

| | | |
|---|---|---|
| JP | 2004-289029 | 10/2004 |
| JP | 2005-50424 | 2/2005 |
| JP | 2005-71500 | 3/2005 |

* cited by examiner

*Primary Examiner*—Thong Q Le  
(74) *Attorney, Agent, or Firm*—Young & Thompson

(57) ABSTRACT

In a memory readout circuit for use in a phase-change memory device comprising phase-change elements as memory cells, a sense amplifier sets readout voltage, which is applied to a selected phase-change element selected among the phase-change elements by a column selecting switch, to voltage equal to or higher than hold voltage but lower than transition voltage of the selected phase-change element in a readout cycle. The selected phase-change element is read out as a dynamic state in the case where the selected phase-change element is in a set state.

18 Claims, 11 Drawing Sheets

MEMORY READOUT CIRCUIT AND PHASE-CHANGE MEMORY DEVICE

This application is based upon and claims the benefit of priority from Japanese patent application No. 2006-314215, filed on Nov. 21, 2006, the disclosure of which is incorporated herein in its entirety by reference.

BACKGROUND OF THE INVENTION

The present invention relates to a phase-change memory and, in particular, to a readout circuit for use in the phase-change memory.

A semiconductor memory includes a volatile memory which loses memory information when power supply is turned off and a nonvolatile memory which retains memory information even when power supply is turned off. For example, the volatile memory is a Dynamic Random Access Memory (DRAM) or a Static Random Access Memory (SRAM), while the nonvolatile memory is an Electrically Erasable Programmable Read Only Memory (EEPROM) or a flash memory. In a recent mobile information terminal, for the purpose of miniaturization and power saving, the flash memory which retains memory information even when power supply is turned off is commonly used.

However, higher performance and/or higher functionality is desired as a recent mobile memory. As a mobile memory, in addition to large capacity, fast access such as a Double Data Rate (DDR) system, multiple bits of a data bit width, and low power consumption for ensuring battery life are required. Thus, a phase-change memory using a phase-change material comes to the front, and its development proceeds. The phase-change memory is a nonvolatile memory using two different phase states of the phase-change material as memory information. A chalcogenide material (such as Ge, Sb and Te) is used as the phase-change material.

FIG. 1 shows a memory cell of a phase-change memory. The memory cell is constituted from a phase-change element GST made of a chalcogenide material (such as Ge, Sb and Te), and a selection transistor C1 for selecting a memory cell. One terminal of the phase-change element GST is connected to a bit line BL of the memory cell, while the other terminal thereof is connected to a drain of the selection transistor C1. A source of the selection transistor C1 is connected to GND, while a gate thereof is connected to a Row selection signal VG. The selection transistor conducts an electric current therethrough in response to the Row selection signal VG, whereby a writing/reading operation is carried out via the bit line BL.

The phase-change element GST uses a property that a chalcogenide material (such as Ge, Sb and Te) becomes either an amorphous state (high resistance) or a crystal state (low resistance) by applying heat thereto. By controlling applied voltage and applied time, the chalcogenide material is changed between a high resistance (reset) state and a low resistance (set) state by means of Joule heat generated by a current. The state where the phase-change element GST becomes a amorphous state to present high resistance is referred to as a "reset state", while the state where the phase-change element GST becomes a crystal state to present low resistance is referred to as a "set state". The phase-change element GST made of a chalcogenide material becomes low resistance at the crystal state, while it becomes high resistance at the amorphous state. The phase-change element GST is a memory element that uses a state difference as memory information. This phenomenon was discovered by Stanford Ovshinsky. Now, the phase-change element by the designation of Ovonic Unified Memory (OUM) and the like gets a lot of attention as a memory material with potential for a universal memory.

Writing into a phase-change element GST requires applying a large current thereto because a phase state of the phase-change element GST is to be changed. Generally, writing current published in a VSLI symposium and/or an ISSCC, in particular, a current at a reset program (changed from a crystal state to an amorphous state) is reported to be in the range of 400 µA to 600 µA. However, in order to satisfy low consumption current required for the mobile memory, it is necessary to reduce this program current. In the ISSCC2006 (P. 140, 7.5 A, 0.1 µm, 1.8V, 256 Mb, and 66 MHz Synchronous Burst PRAM), a method of reducing a consumption current by reducing a bit width simultaneously programmed has been proposed as a method of reducing a program current in a product specification.

A mobile memory is required to reduce a reset program current to the range of about 100 µA to 200 µA. Thus, the search for a composition or material for a phase-change element GST is proceeding. It is also required that access time achieves fast access like a DRAM, and internal access speed thereof is desired to be in the range of about 10 ns to 20 ns. FIG. 2 shows a relationship diagram between a reset program current Ireset and values of a set resistance Rset and a reset resistance Rrst at a set state and a reset state. As shown in FIG. 2, the value of each of the resistances Rset and Rrst of the phase-change element GST considerably changes in the range of one or two order or more as the program current value changes. A phenomenon is seen which reset and set resistance values increase when a reset program current (Ireset) is reduced.

As will be described later, a set program current (Iset) is less than a reset program current (Ireset), and the maximum voltage and the maximum current at the programming are restricted. For example, a set program current Iset in FIG. 2 is set to about 60% of the current value of the reset program current Ireset. For example, in the case of the reset program current of 200 µA, the reset resistance is about 10 MΩ, and the set resistance is about 100 KΩ. In the case of the set resistance of 100 KΩ, the set readout current becomes lower to about 4 µA. Thus, there has been a problem that it is difficult to achieve fast readout because the set readout current becomes smaller.

Hereinafter, these problems will be described more in detail. FIG. 3 shows a circuit diagram of a sense amplifier and a column selecting switch (hereinafter, referred to as a "Y switch") as a conventional readout circuit. FIG. 4 shows a relationship diagram between a program resistance value and voltage V in the phase-change element GST. FIG. 5 shows a relationship diagram between a program resistance value and a current I in the phase-change element GST. FIG. 6 shows profiles of current and temperature at programming of a phase-change memory. FIG. 7 and FIG. 8 respectively show volt-ampere characteristic diagrams at an amorphous state (reset state) and a crystal state (set state) of the phase-change element GST.

In FIG. 6 which shows profiles of current and temperature at programming of a general phase-change memory, program time is shown in the horizontal axis, while current and temperature profiles are shown in the longitudinal axis. Since the temperature profile here is determined by the supplied current, it is simplified and shown as the same as the current profile. In the case where the phase-change element GST is changed to an amorphous state, a large reset program current Ireset is supplied for a short time. The phase-change element GST is caused to generate heat due to the reset program current until the temperature exceeds melted temperature (Tm), and the phase-change element GST is then cooled rapidly. Rapid cooling causes the phase-change element GST to become an amorphous state.

Further, in the case where the phase-change element GST is changed from the amorphous state to a crystal state, a set program current Iset smaller than the reset program current Ireset is supplied to the phase-change element GST for a time longer than that at the reset program. The phase-change element GST is caused to generate heat for a long time at temperature lower than the melted temperature (Tm). Slow cooling from low temperature causes the phase-change element GST to become a crystal state. Generation of heat when to change the phase states is caused by a current flowing to a phase-change element material itself or resistance (R) such as a heater material. The product of a square value of the flowing current (I) and the resistance (R) is a calorific value.

In FIG. 7 which shows a device property of the phase-change element GST at a reset state, applied voltage is shown in the horizontal axis, while a current is shown in the longitudinal axis. The applied voltage VGST to the reset resistance Rrst in the phase-change element GST at a reset state is gradually raised. When the applied voltage reaches predetermined constant voltage Vth, the slope in FIG. 7 changes largely, and a phenomenon in which the current according to dynamic resistance Rdyn flows rapidly occurs. This phenomenon is called as Ovonic Threshold Switching (OTS). This voltage Vth is called as transition voltage. When the current more than the minimum reset program current Ireset(min) is applied after occurrence of OTS, the phase-change element GST is changed to a reset state.

Further, when a current less than the maximum set program current Isafe but more than the minimum set program current Iset(min) is applied thereto, the phase-change element GST is allowed to change to a set state. The difference between the minimum reset program current Ireset(min) and the maximum set program current Isafe is a margin of the program current for programming the phase-change element GST to either the reset state or the set state. The voltage VGST when obtaining the maximum set program current Isafe is defined as maximum set program voltage Vsafe. Moreover, the transition voltage Vth at which OTS occurs varies depending on temperature dependency and/or a condition of a phase-change film. The maximum and minimum values of the transition voltage Vth are respectively defined as Vth(Max) and Vth(Min).

In FIG. 8 which shows a device property of the phase-change element GST at a set state, applied voltage is shown in the horizontal axis, while a current is shown in the longitudinal axis. Set resistance Rset is first indicated with respect to the applied voltage VGST. When the applied voltage VGST becomes predetermined voltage VH or more, it is under dynamic resistance Rdyn. The voltage VH at which the resistance property is changed is called as hold voltage VH. In the programming from a set state to a reset state, by applying the maximum set program voltage Vsafe or more thereto to supply the current of the minimum reset program current Ireset (min) or more thereto, the phase-change element GST is allowed to phase-change to a reset state.

Next, readout voltage Vread and readout current Iread at a reset state and a set state of the phase-change element will be described. At the reset state shown in FIG. 7, the readout voltage Vread has first to be set to the transition voltage Vth(min) or less. This is because of reasons as follows. In the case where voltage over the transition voltage Vth(min) is applied to a bit line BL, OTS occurs in the phase-change element to become a region of the dynamic resistance Rdyn.

A current larger than the reset readout current Iread that flows when the phase-change element has high resistance thus flows. For that reason, it is mistakenly determined that the set readout current at low resistance state flows, whereby it is impossible to read out normally.

The readout current Iread has also to be the minimum set program current Iset(min) or less. This is because of reasons as follows. In the case where the applied voltage becomes the transition voltage Vth(min) or more even instantaneously when the readout voltage is applied to the bit line BL, the phase-change element GST becomes the dynamic resistance Rdyn region, whereby the current of the minimum set program current Iset(min) or more flows thereto. In this case, a phase change occurs in the phase-change element GST that is written to a reset state even though the readout is carried out, whereby the phase-change element GST may be rewritten to a set state. Mistakenly writing at the readout in this manner is referred to as "read disturb".

Similarly, in the case of the set state in FIG. 8, similar conditions are also required. The readout voltage Vread has to be the maximum set program voltage Vsafe or less. In addition, in the case where the readout current Iread is the maximum set program current Isafe or less, the phase-change element GST leads to a reset state. This results in a permissible range. Ranges of readout voltage and a current for satisfying both conditions at the reset state and the set state are as follows.

$$V\text{read} < V\text{th}(\text{Min}) < VH (< V\text{safe}) \quad \text{Formula (1)}$$

$$I\text{read} < I\text{set} \ (< I\text{safe}) \quad \text{Formula (2)}$$

Thus, the ranges of the readout voltage and the current are required to be set so as to satisfy the conditions of the formulas (1) and (2) at the programming and readout for the phase-change element. These setups allow the phase-change element GST to function as a nonvolatile memory without erasing the written data at the readout.

In FIG. 3, a circuit diagram of a sense amplifier 201 and a Y switch 203 is shown as a conventional readout circuit. In a Magnetic Random Access Memory (MRAM) or a Resistance Random Access Memory (RRAM) end a memory element of a resistance program system such as a phase-change memory, a current sense amplifier type of sense amplifier is normally utilized. The current sense amplifier is a sense amplifier that reads out and detects a current flowing to a resistance element to amplify it. The sense amplifier 201 is set up so as to ensure the readout voltage and the current according to the formulas (1) and (2).

A bias circuit (including a comparator circuit 101 and a PMOS transistor P2) for controlling voltage and a current on the bit line BL in the memory cell is incorporated in the sense amplifier 201. The sense amplifier 201 is constituted from PMOS transistors P1, P2, a NMOS transistor N1 and a comparator circuit 101. The Y switch 203 is constituted from a plurality of NMOS transistors N3, N4. The sense amplifier 201 is connected to the Y switch 203 at the connection node Vbit so as to be connected to the bit line BL of the memory cell via the Y switch 203. In the following circuit diagrams, a NMOS transistor is represented by a transistor Nxx, while a PMOS transistor is represented by a transistor Pxx.

Drain, source and gate of the transistor P1 are respectively connected to a source of the transistor P2, a power supply Vdd, and a standby signal STB. Drain, source and gate of the transistor P2 are respectively connected to a sense amplifier output Vsa, the drain of the transistor P1, and reference voltage Vref. Drain, source and gate of the transistor N1 are respectively connected to the sense amplifier output Vsa, the connection node Vbit, and an output from the comparator circuit 101. A drain of each transistor in the Y switch 203 is connected to the connection node Vbit. Gates of the transistors in the Y switch 203 are respectively connected to Y selection signals (Y0, . . . and Yn). Sources thereof are respectively connected to the bit lines BL of the memory cells.

The connection node Vbit and the clamp voltage Vclmp are inputted to the comparator circuit 101, and the comparator circuit 101 outputs a comparison result to the gate of the transistor N1. A conductive state of the transistor N1 is controlled on the basis of the output from the comparator circuit 101 so that voltage of the connection node Vbit becomes equal to the clamp voltage Vclmp. By setting the clamp voltage Vclmp to voltage according to the formula (1), it is possible to hold the connection node Vbit to optimal constant voltage (clamp voltage Vclmp). Since the voltage applied to the memory cell is the same as the voltage at the connection node Vbit, the clamp voltage Vclmp is applied as the readout voltage.

Further, the maximum flowing current is set to the minimum set program current Iset(min) or less depending on the reference voltage Vref, which is a gate input of the transistor P2. The current flowing to the transistor P2 is the same as the current flowing to the transistor N1 and the readout current Iread of the memory cell. The readout current Iread becomes the minimum set program current Iset(min) or less, whereby it is possible to satisfy the formula (2).

During readout of the memory cell, the readout current Iread flows in accordance with memory information of the memory cell selected by the Y selection signal. The difference between the readout current Iread at a set state and a reset state causes output voltage of the sense amplifier output Vsa to be differentiated. The memory information in the memory cell is outputted as the sense amplifier output Vsa. Moreover, a comparator circuit (not shown in the drawings) compares and determines the sense amplifier output Vsa with the reference amplifier output to output a comparison result to an external interface circuit as memory cell data.

Next, the specific operation will be described with reference to current-voltage characteristics of the phase-change element. Here, it is assumed that transition voltage Vth(min) of the phase-change element is 0.5V and the minimum set program current Iset(min) is 50 µA. In this case, in view of a margin of the readout operation, the readout voltage Vread can be set to 0.4V, and set readout current Iread can be set to 40 µA. In order to achieve a fast readout operation, it is required to ensure the set readout current of a predetermined level or more. In order to ensure the set readout current Iread to 40 µA, it is desired that the set resistance value is 10 KΩ or less. Further, in view of production tolerance or the like, it is desired that the reset resistance value at a reset state has a margin in the range of one or two order with respect to the set resistance. It is desired that the reset resistance value is 1,000 KΩ or more.

It is necessary that a device property of the phase-change element GST is set so that the readout voltage Vread is 0.4V and the set readout current Iread is 40 µA. As shown in FIG. 4, even when the program resistance is 10 MΩ, the voltage VGST is held at 0.4V. Namely, even though the reset resistance increases up to about 10 MΩ, it is possible to keep the voltage VGST applied to the phase-change element GST at 0.4V or less. No OTS thus occurs.

Moreover, as shown in FIG. 5, the device property of the phase-change element GST is set so that the set readout current of 40 µA flows when the program resistance is 10 KΩ. When the resistance further increases up to 100 KΩ, the set readout current Iread becomes about 4 µA. Further, in the case where the resistance becomes too lower so that the resistance value is 1 KΩ, a current of 40 µA or more does not flow because current control is carried out at the transistor P2 in the sense amplifier. In FIG. 4 and FIG. 5, the voltage and current are controlled in accordance with the Ohm's law.

In this case, the program resistance satisfying that the readout voltage Vread is 0.4V and the set readout current Iread is 40 µA becomes 10 KΩ for the set resistance and 1,000 KΩ for the reset resistance. By carrying out the setting in this manner to constantly keen the current and voltage to be supplied to the phase-change element GST, it is possible to realize a nonvolatile memory and to achieve fast readout.

However, according to FIG. 2, the reset program current Ireset required to obtain the resistance value is about 800 µA, and the set program current Iset thereof thus becomes 480 µA (obtained by multiplying 800 by 60%). In the mobile memory required to reduce power consumption, the reset program current Ireset of 200 µA or less is required. In the case where the reset program current Ireset is 200 µA, the set resistance is 100 KΩ and the set resistance is 10,000 KΩ. The set readout current when the set resistance is 100 KΩ becomes 4 µA, and a fast readout operation is thus hardly carried out. In the case where the program current is made smaller in the phase-change memory in this manner, the set resistance value becomes larger. Therefore, there has been a problem that it is difficult to carry out fast readout because the readout current at a set state becomes smaller.

There are following patent documents as prior patent documents regarding a variable resistance value type of memory device. A memory cell disclosed in Japanese Unexamined Patent Application Publication No. 2005-71500 includes two selection transistors in parallel. One selection transistor conducts an electric current therethrough at readout, while two selection transistors conduct an electric current therethrough at writing, whereby the current flowing to the phase-change element is controlled. In Japanese Unexamined Patent Application Publication No. 2005-50424, writing conditions in which a writing voltage level and drop speed are differentiated in accordance with a verifying result of writing data are utilized. However, the above-mentioned patent documents are documents relating to a technique to program precisely, and they fail to disclose the problems in the case where the reset program current is made smaller according to the present invention.

SUMMARY OF THE INVENTION

In the phase-change memory as described above, in the case where a program current to a phase-change element is made smaller, a set resistance value and a reset resistance value become larger. There has been a problem that a readout current at a set state becomes smaller, and this makes it difficult to read out fast. In view of the above-mentioned problems, it is an object of the present invention to provide a memory readout circuit and a phase-change memory device comprising the memory readout circuit capable of fast readout even in the case where the set resistance value becomes higher.

In order to achieve the above-mentioned object, the present application basically adopts the following techniques. It will readily be understood that the present application also encompasses applied techniques as various modifications without departing from the technical scope of the present invention.

Memory readout circuits according to this invention and phase-change memory devices according to this invention are as follows:

(1) A memory readout circuit for use in a phase-change memory device comprising phase-change elements as memory cells, the memory readout circuit comprising a column selecting switch and a sense amplifier, wherein the sense amplifier sets readout voltage, which is applied to a selected phase-change element selected among the phase-change elements by the column selecting switch, to voltage equal to or higher than hold voltage of the selected phase-change element but lower than transition voltage of the selected phase-change element in a readout cycle, and the selected phase-change element is read out as a dynamic state in the case where the selected phase-change element is in a set state.

(2) The memory readout circuit as described in (1), further comprising:

a slowly cooling circuit connected to a connection node between the column selecting switch and the sense amplifier, wherein after latching data read out from the selected phase-change element, the slowly cooling circuit causes a current flowing to the selected phase-change element to be reduced to slowly cool the selected phase-change element, whereby the selected phase-change element is restored to the set state.

(3) The memory readout circuit as described in (2), wherein the slowly cooling circuit changes impedance between the connection node and a power supply in response to a slow-cooling control signal to cause a current flowing to the selected phase-change element to be reduced.

(4) The memory readout circuit as described in (3), wherein the slowly cooling circuit is constituted from first and second transistors and a comparator circuit, the first and second transistors being connected in series between the connection node and the power supply, and wherein the first transistor controls a flowing current by means of the slow-cooling signal, and voltage of the connection node and clamp voltage are inputted into the comparator circuit and an output from the comparator circuit is used as a gate input of the second transistor to control the voltage of the connection node.

(5) The memory readout circuit as described in (2), wherein the slowly cooling circuit changes impedance between the connection node and ground voltage in response to a slow-cooling control signal to cause a current flowing to the selected phase-change element to be reduced.

(6) The memory readout circuit as described in (5), wherein the slowly cooling circuit is constituted from a transistor, and wherein in the transistor, a drain is connected to the connection node; a source is connected to the ground voltage; and the transistor conducts an electric current in response to the slow-cooling control signal inputted to a gate thereof.

(7) The memory readout circuit as described in (5), wherein the slowly cooling circuit is constituted from an inverter circuit, and the inverter circuit comprises a load transistor and a drive transistor, and wherein an output from the inverter circuit is connected to the connection node, and the drive transistor of the inverter circuit conducts an electric current in response to the inputted slow-cooling control signal.

(8) A phase-change memory device comprising phase-change elements as memory cells and a memory readout circuit, the memory readout circuit comprising a column selecting switch and a sense amplifier, wherein the sense amplifier sets readout voltage, which is applied to a selected phase-change element selected among the phase-change elements by the column selecting switch, to voltage equal to or higher than hold voltage of the selected phase-change element but lower than transition voltage of the selected phase-change element in a readout cycle, and the selected phase-change element is read out as a dynamic state in the case where the selected phase-change element is in a set state.

(9) The phase-change memory device as described in (8), further comprising:

a latch amplifier circuit; and a slowly cooling circuit connected to a connection node between the column selecting switch and the sense amplifier, wherein the s phase-change memory device has a slowly cooling period of time in which: the sense amplifier reads out data from the selected phase-change element in the readout period of time; the latch amplifier circuit latches the data; and the slowly cooling circuit then causes a current flowing to the selected phase-change element to be reduced to slowly cool the selected phase-change element, whereby the selected phase-change element is restored to the set state.

(10) The phase-change memory device as described in (9), wherein in the slowly cooling period of time, a supply current from the slowly cooling circuit is caused to be reduced in response to a slow-cooling control signal to cause a current flowing to the selected phase-change element to be reduced.

(11) The phase-change memory device as described in (9), wherein in the slowly cooling period of time, a current shunted to the slowly cooling circuit is caused to be increased in response to a slow-cooling control signal to cause a current flowing to the selected phase-change element to be reduced.

The memory readout circuit of the present invention sets the readout voltage to higher, and reads out dynamic resistance at readout of a set state. Since the dynamic resistance is less than set resistance, a large set readout current is obtained. Thus, it is possible to obtain the effect to be capable of a fast readout operation. Further, the readout circuit includes a slowly cooling circuit. The slowly cooling circuit slowly cools the phase-change element after reading out data, thereby preventing read disturb. This makes it possible to restore the phase-change element to a set state. By constructing in this manner, a readout circuit and a system capable of fast readout, and a phase-change memory device provided with the readout circuit can be obtained.

DESCRIPTION OF THE EXEMPLARY EMBODIMENTS

A readout circuit for a phase-change memory according to the present invention will now be described with reference to the drawings. A phase-change memory of the present invention reads out a phase-change element as a dynamic state at readout of a set state. Since a resistance value of the phase-change element becomes lower at the dynamic state, a large set readout current is obtained. It is further characterized that the phase-change element is restored to the set state by means of a slowly cooling circuit after reading out.

The phase-change element of the present invention is programmed by means of a small program current, and set resistance thereof is large. Transition voltage Vth of the phase-change element is set so as to become higher. It is thought that transition voltage Vth of a phase-change element GST depends on an electric field to the phase-change element GST. For example, by making a film thickness of the phase-change element GST thicker, it is possible to set the transition voltage Vth to higher. Moreover, readout voltage is set to high voltage less than transition voltage Vth(min) but equal to or higher than hold voltage VH.

In the case where the phase-change element is in the set state, the readout voltage becomes higher than the hold voltage. The phase-change element thus becomes a dynamic state. Since a resistance value at the dynamic state is lower than a set resistance value, a large set readout current is obtained. In the case where the phase-change element is in a reset state, the readout voltage becomes lower than the transition voltage Vth(min). The phase-change element thus becomes a reset state. Since a resistance value at the reset state is very large, a reset readout current hardly flows. A large set readout current is obtained at the set state, while a small reset readout current is obtained at the reset state. This makes it possible to carry out a fast readout operation.

In the case where the readout voltage is made high as described above, the phase-change element is set to a dynamic state at readout of a set state. Dynamic resistance is one lower than set resistance, and it may lead to an excessive readout current. There is a fear that the phase-change element is accidentally programmed to a reset state due to heat generation by the readout current at this time. Thus, in order to reprogram the phase-change element to the set state, a current flowing to the phase-change element is gradually reduced by the slowly cooling circuit after the readout, whereby the temperature of the phase-change element is slowly lowered. The slow cooling allows the phase-change element to be restored to the set state. The read-out data are held by a latch amplifier circuit during a slowly cooling period of time so that the output data are not changed.

Figure 1:
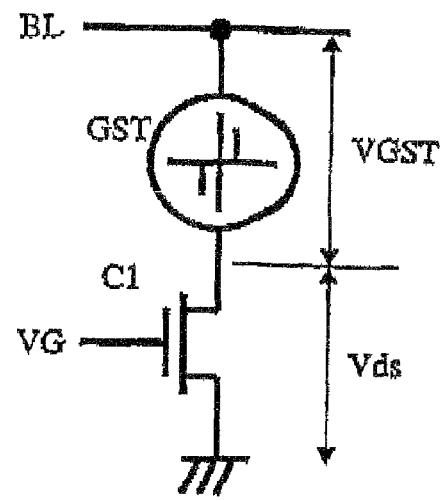
FIG. 1 is a circuit diagram of a phase-change memory cell.
Figure 2:
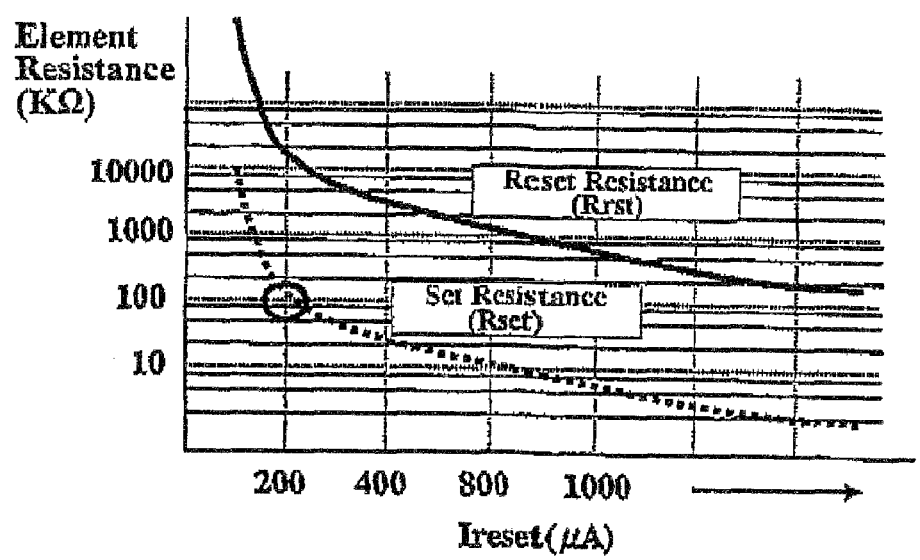
FIG. 2 is a relationship diagram between a program current and resistance in the phase-change element.
Figure 3:
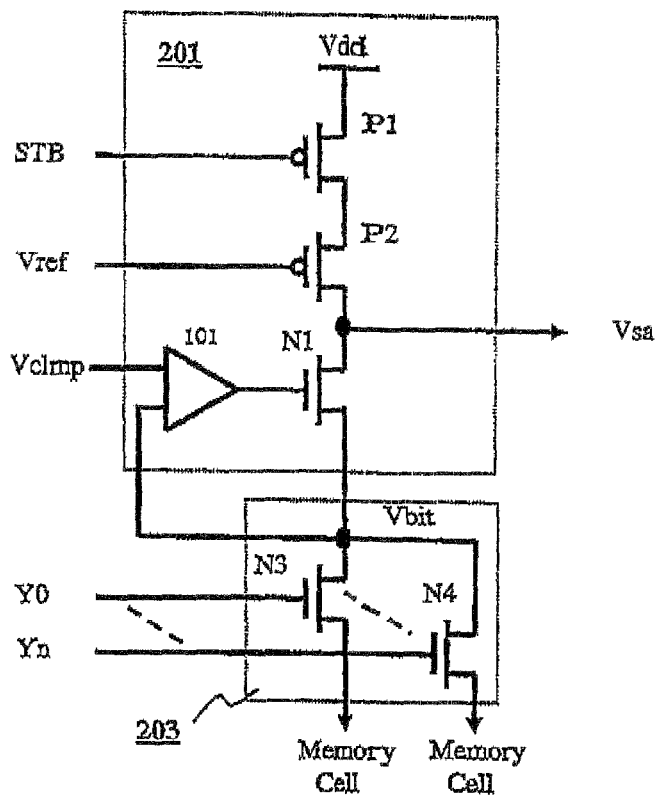
FIG. 3 is a circuit diagram of a conventional readout circuit (including a sense amplifier and a Y switch)
Figure 4:
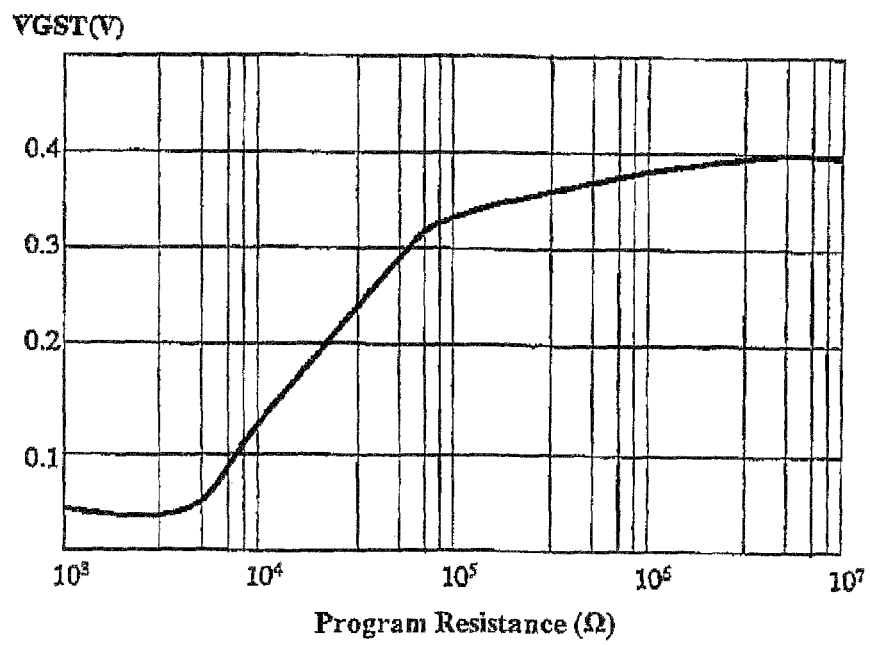
FIG. 4 is a relationship diagram between a program resistance value and applied voltage in the phase-change element.
Figure 5:
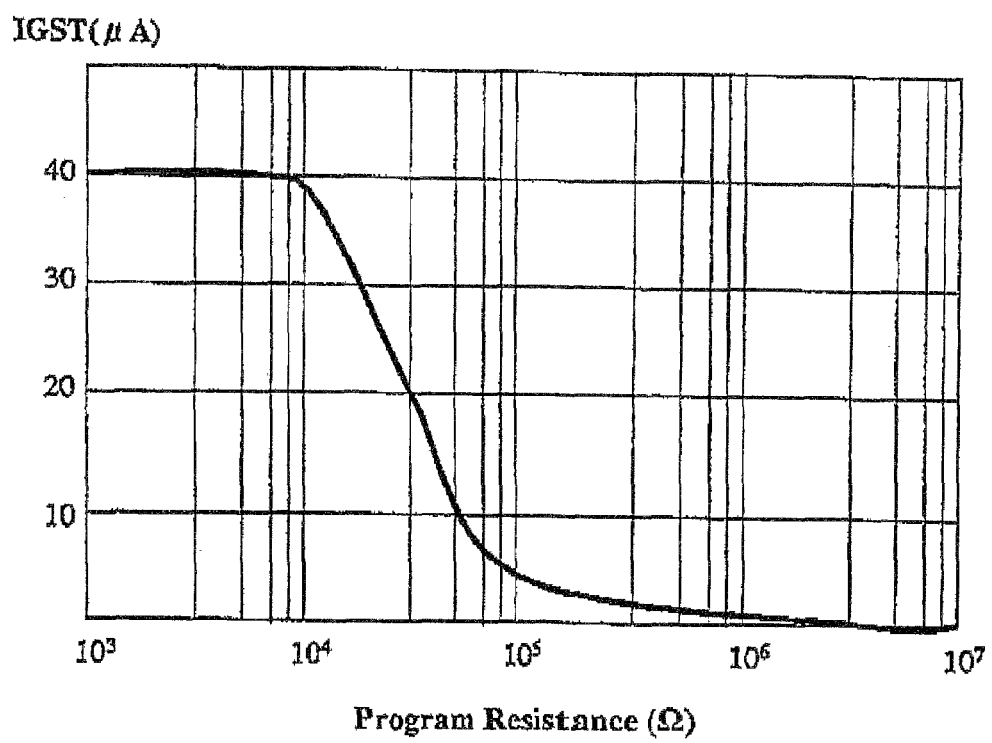
FIG. 5 is a relationship diagram between a program resistance value and a readout current in the phase-change element.
Figure 6:
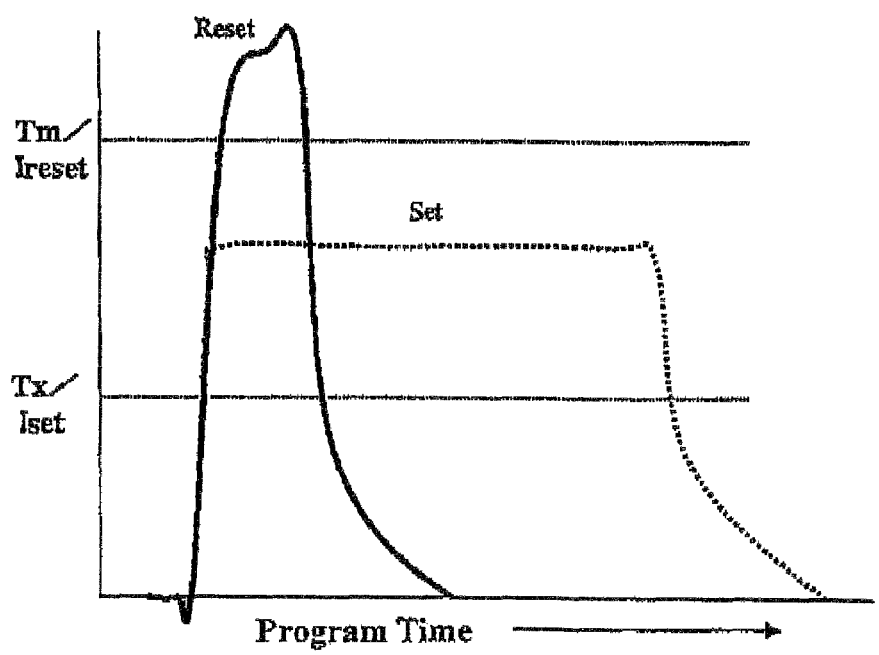
FIG. 6 is waveform diagrams of current and temperature at programming of the phase-change element.
Figure 7:
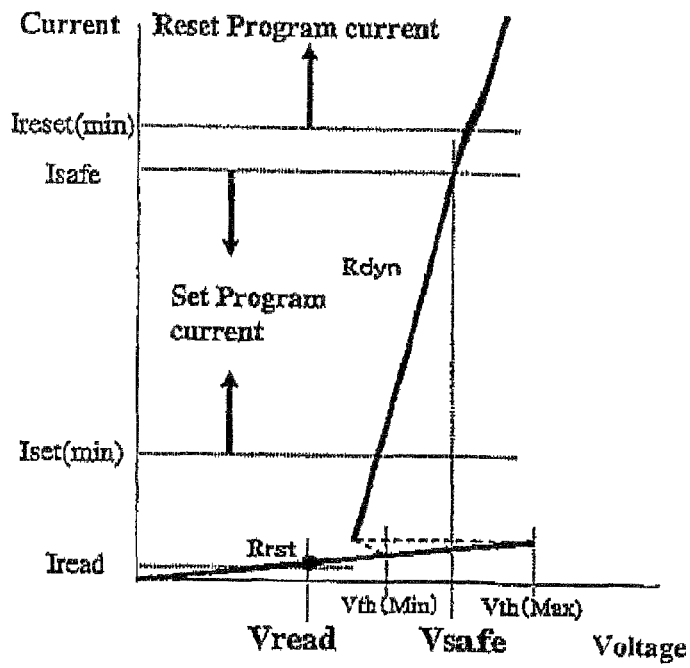
FIG. 7 is a volt-ampere characteristic diagram at a reset state of a conventional phase-change element.
Figure 8:
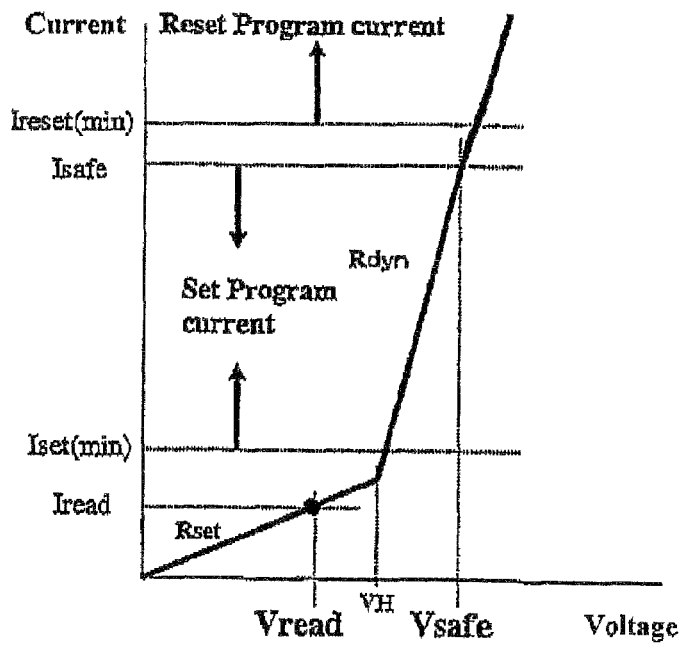
FIG. 8 is a volt-ampere characteristic diagram at a set state of a conventional phase-change element.
Figure 9:
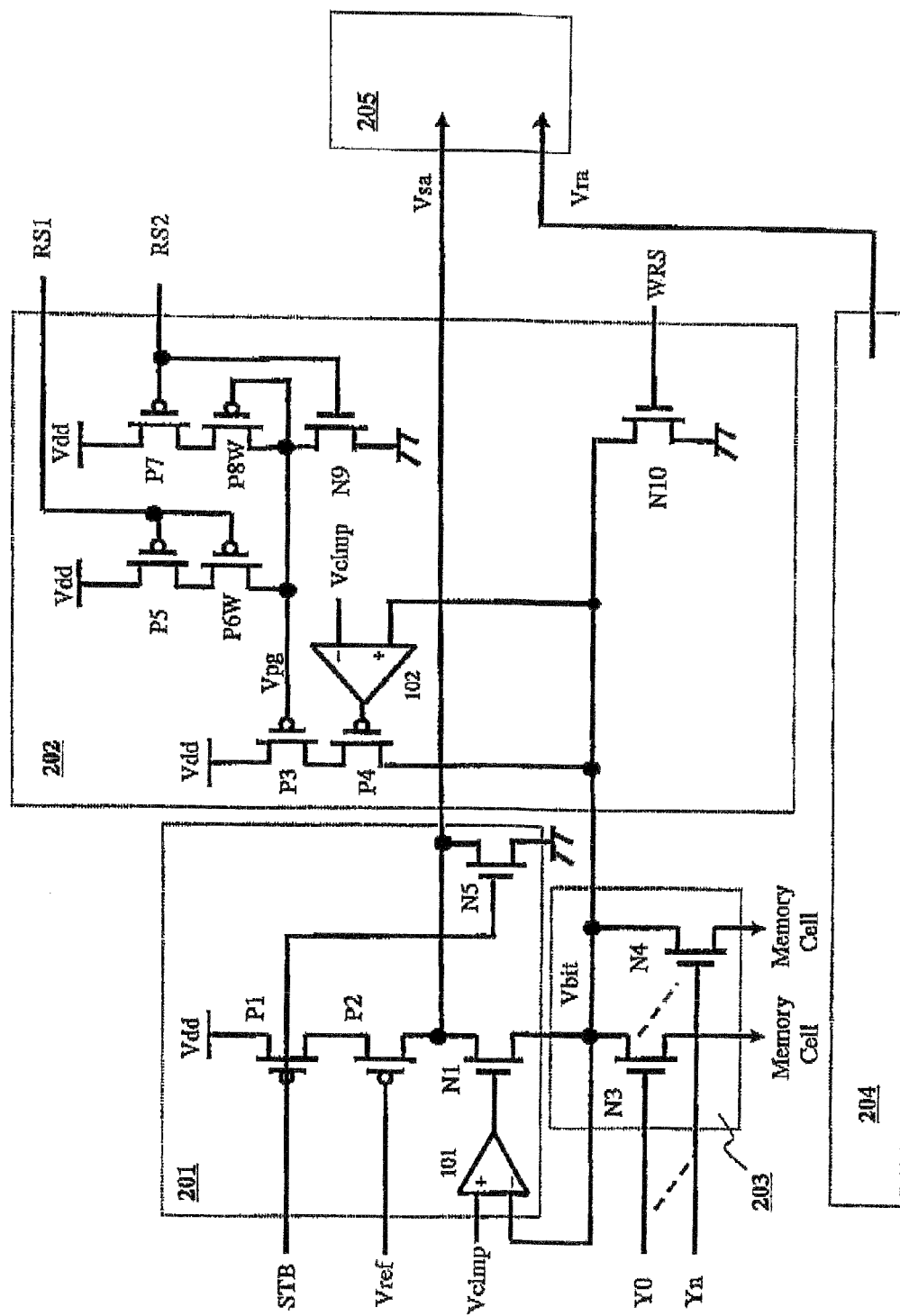
FIG. 9 is a circuit diagram of a readout circuit according to a first embodiment of the present invention.

Referring to FIG. 9, the configuration of the readout circuit according to the present invention will be described. The readout circuit is constituted from a sense amplifier 201, a slowly cooling circuit 202, a Y switch (or a column selecting switch) 203, a reference amplifier 204, and a differential amplifier circuit or latch amplifier circuit (hereinafter, referred to as the "latch amplifier circuit") 205.

The sense amplifier 201 is connected to the Y switch 203 at a connection node Vbit, and connected to a bit line BL of a memory cell via the Y switch 203. Data stored in a selected memory cell are read out by the Y switch 203 to output the data as a sense amplifier output Vsa. Further, a constant voltage control circuit (for example, comparator circuit 101) for setting voltage of the connection node Vbit and a constant current control circuit (for example, transistor P2) for setting a flowing current are included in the sense amplifier.

The slowly cooling circuit 202 controls a current flowing to the phase-change element to slowly lower the temperature of the phase-change element. As the slowly cooling circuit 202, a method of supplying a current to the connection node Vbit as will be described later in the embodiments and a method of shunting a current to the connection node Vbit may be mentioned. The Y switch 203 is connected to the sense amplifier 201 at the connection node Vbit to transmit the data of the selected memory cell to the sense amplifier 201 in response to a Y selection signal. The reference amplifier 204 outputs a reference amplifier output Vra to be compared with the sense amplifier output Vsa. The latch amplifier circuit 205 compares the reference amplifier output Vra with the sense amplifier output Vsa to hold the data.

In phase-change memory readout, a bit line of a memory cell is first selected by the Y switch 203, and stored data are read out to the connection node Vbit. The stored data of the connection node Vbit are inputted to the sense amplifier 201, and the sense amplifier 201 outputs it as the sense amplifier output Vsa. The latch amplifier circuit 205 compares the sense amplifier output Vsa with the reference amplifier output Vra from the reference amplifier 204 to amplify the comparison result. The latch amplifier circuit 205 holds the data after the data are fixed. The slowly cooling circuit 202 controls the connection node Vbit after the data are fixed to gradually reduce the current flowing to the phase-change element, whereby the temperature of the phase-change element is controlled.

Figure 10:
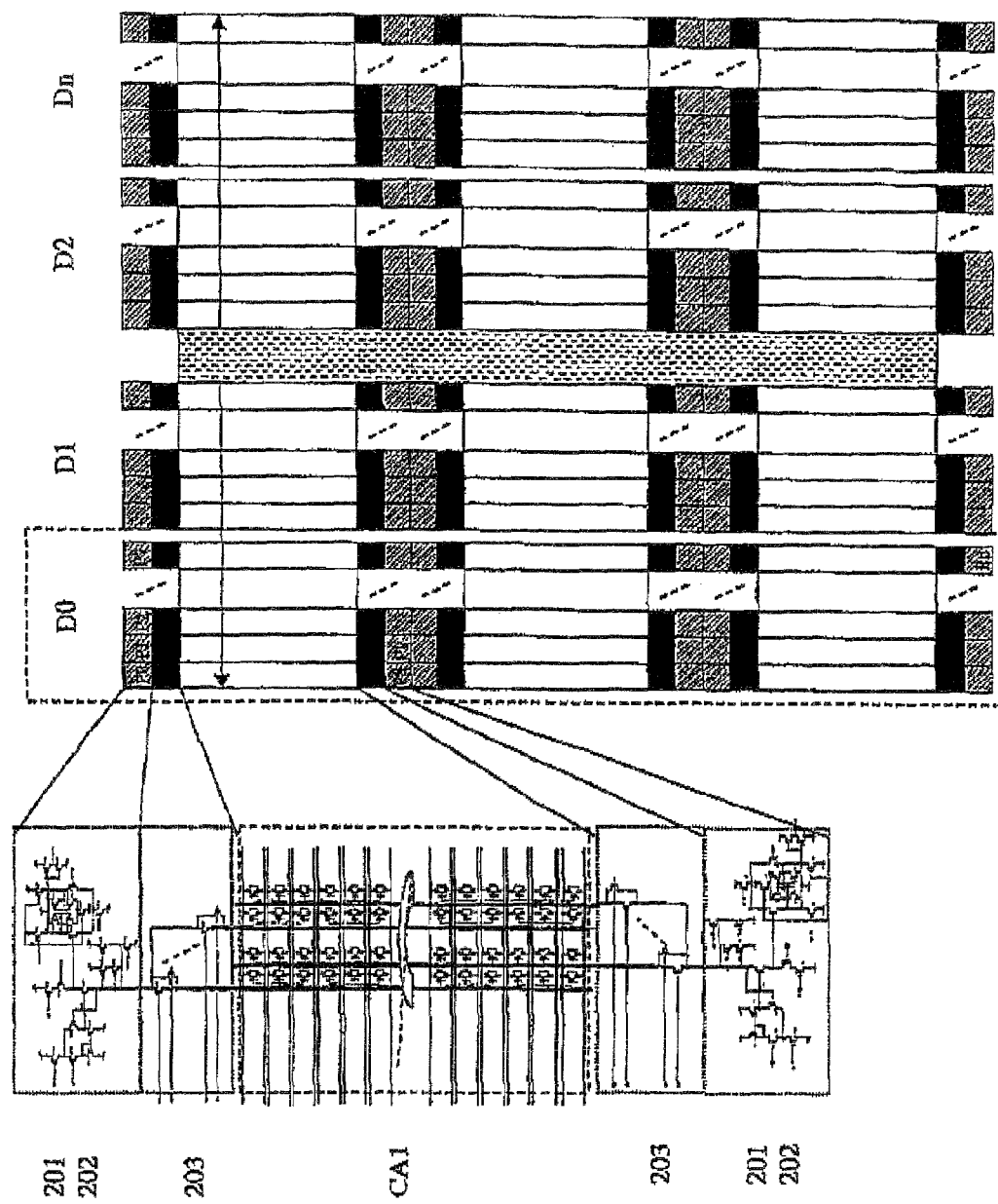
FIG. 10 is a circuit block diagram of the phase-change memory according to the present invention.

Next, a constituent example of the memory device of the present invention is shown in FIG. 10. In a memory cell array CA1, memory cells are arranged in an array manner. A unit array is constituted from two Y switches 203 respectively connecting to the memory cell, two sense amplifiers 201 and two slowly cooling circuits 202. D0, D1, . . . and Dn respectively represents data out circuits.

In the unit array, the two sense amplifiers 201, the two slowly cooling circuits 202 and the two Y switches 203 are disposed above and below one memory cell array CA1, respectively. A concept of page(s) is applied to this one set. The unit array here constitutes 2 pages. This unit arrays are arranged in each data out circuit as a plurality of pages (P0 to Pn). For example, in the case of a normal synchronous DRAM or the like, the page number is constituted from 512 pages. A memory device is thus constructed by arranging 256 unit arrays. In accordance with the page number and memory capacity, the number of memory elements, the number of bit lines, the number of word lines and the like required for the unit array may be selected freely, and they may be arbitrarily laid out with a unit capable of constituting minimum chip area.

For example, in the case of carrying out fast page access, desired pages are accessed in turn while a Y selection signal Y0 for selecting a bit line is activated. For example, the case where an area of the page P0 is selected to carry out readout and an area of page P1 is next read out will now be described. A sense amplifier for the page P0 is first activated, and data are latched. At the same time when a latch amplifier circuit in a readout circuit for the page P0 transmits the data to a data out circuit D0, a readout circuit for the page P1 is activated. On the other hand, although a slowly cooling operation is carried out in the readout circuit for the page P0, this does not influence the readout operation of the page P1. Namely, readout speed is completely unaffected, and fast access can thus be carried out. This makes it possible to carry out a slowly cooling operation in the readout circuit previously selected without any influence on subsequent readout.

According to the phase-change memory readout circuit of the present invention, it is possible to program a phase-change element with a small reset program current. In the case where the phase-change element is programmed with a small reset program current, set resistance Rset and reset resistance Rreset become larger, and thus a set readout current becomes smaller, whereby fast readout cannot be carried out. Thus, the readout voltage is set to voltage equal to or higher than the hold voltage, and the phase-change element is set to a dynamic state at the set readout, whereby the set readout current becomes larger. Moreover, in order to prevent read disturb at a reset state, the current flowing to the phase-change element is gradually reduced after the readout to restore the phase-change element to a set state. A phase-change memory cell having a small program current and a large set readout current is thus obtained. Further, a phase-change memory device capable of fast readout is obtained.

Hereinafter, a system of the memory readout circuit for realizing the present invention will be described in detail as some embodiments.

First Embodiment

Figure 11:
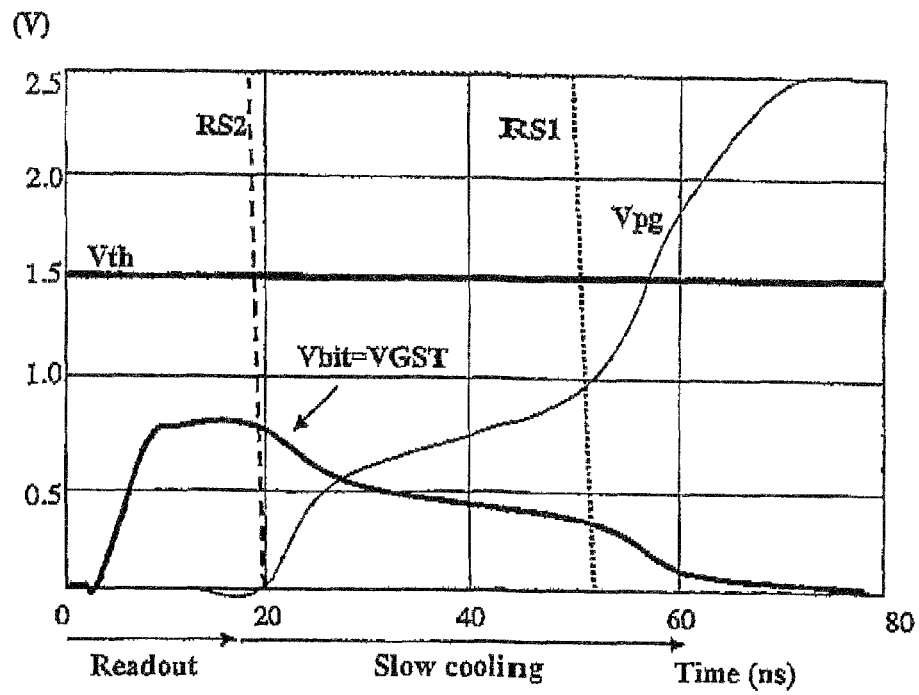
FIG. 11 is a waveform diagram of operating voltage in the readout circuit of FIG. 9.
Figure 12:
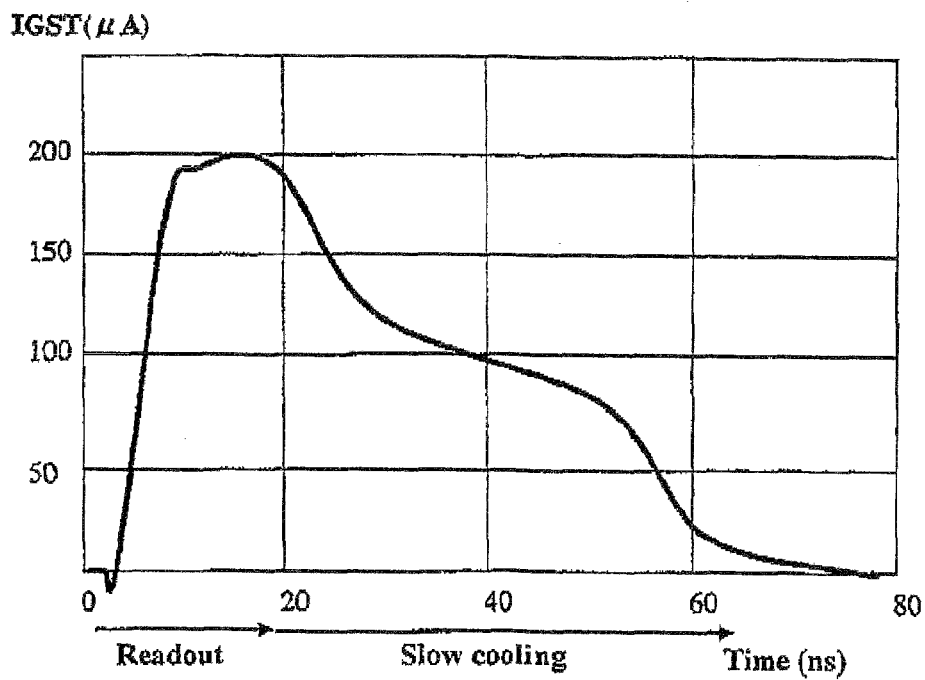
FIG. 12 is a waveform diagram of an operating current in the readout circuit of FIG. 9.
Figure 13:
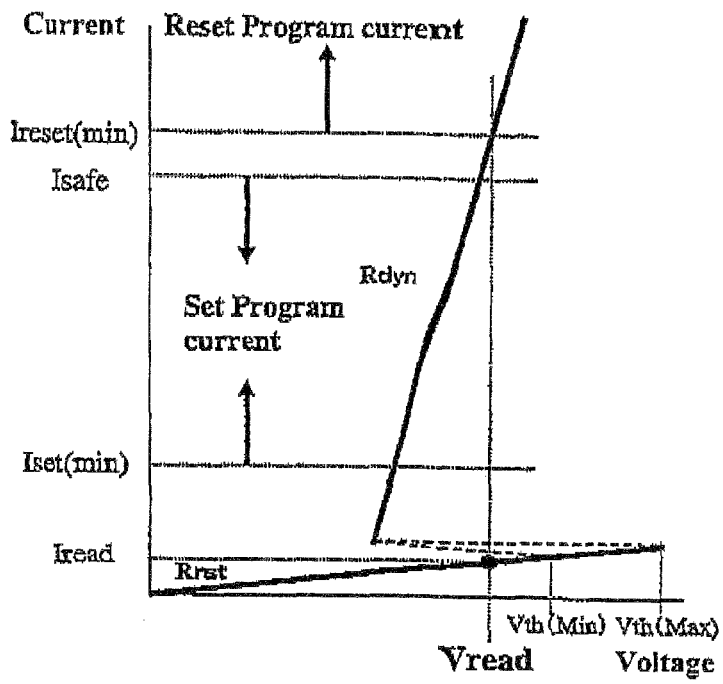
FIG. 13 is a volt-ampere characteristic diagram at a reset state of a phase-change element according to the present invention.
Figure 14:
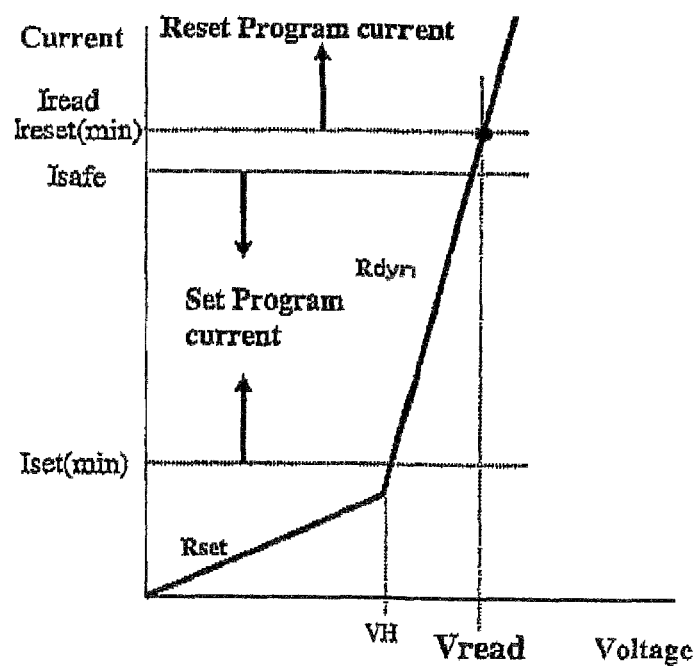
FIG. 14 is a volt-ampere characteristic diagram at a set state of a phase-change element according to the present invention.

A readout circuit for a phase-change memory according to a first embodiment of the present invention will now be described in detail with reference to FIG. 9 and FIGS. 11 to 14. FIG. 9 is a circuit diagram of a readout circuit according to a first embodiment of the present invention. FIG. 11 and FIG. 12 respectively show a waveform diagram of operating voltage and a waveform diagram of an operating current. FIG. 13 and FIG. 14 respectively show volt-ampere characteristics of the phase-change element at reset and set states.

In FIG. 9, the readout circuit is constituted from a sense amplifier 201, a slowly cooling circuit 202, a Y switch 203, a reference amplifier 204 and a latch amplifier circuit 205. In readout, a bit line of a memory cell is first selected by the Y switch 203, and stored data are read out to the connection node Vbit. The stored data of the connection node Vbit are inputted to the sense amplifier 201, and the sense amplifier 201 outputs it as the sense amplifier output Vsa. The latch amplifier circuit 205 compares the sense amplifier output Vsa with the reference amplifier output Vra from the reference amplifier 204. The latch amplifier circuit 205 holds the data after the data are fixed. The slowly cooling circuit 202 controls voltage of the connection node Vbit. After the readout data are latched by the latch amplifier circuit 205, the slowly cooling circuit 202 reduces a current flowing to the phase-change element.

The sense amplifier 201 is constituted from PMOS transistors P1, P2, NMOS transistors N1, N5, and a comparator circuit 101. Drain, source and gate of the transistor P1 are respectively connected to a source of the transistor P2, a power supply Vdd, and a standby signal STB. Drain, source and gate of the transistor P2 are respectively connected to a sense amplifier output Vsa, the drain of the transistor P1, and reference voltage Vref. Drain, source and gate of the transistor N1 are respectively connected to the sense amplifier output Vsa, the connection node Vbit, and an output from the comparator circuit 101. Drain, source and gate of the transistor N5 are respectively connected to the sense amplifier output Vsa, GND, and the standby signal STB.

The connection node Vbit of the Y switch and the clamp voltage Vclmp are inputted to the comparator circuit 101, and the comparator circuit 101 outputs a comparison result to the gate of the transistor N1. A conductive state of the transistor N1 is controlled on the basis of the output from the comparator circuit 101 so that voltage of the connection node Vbit becomes equal to the clamp voltage Vclmp. The comparator circuit 101 and the transistor N1 operate the connection node Vbit so as to be equal to the clamp voltage Vclmp. Since the readout voltage applied to the selected memory cell is equal to the voltage of the connection node Vbit, this causes supply of the clamp voltage Vclmp. In the present embodiment, the clamp voltage Vclmp is set to 0.8V. Further, a conductive state of the transistor P2 is controlled on the basis of a voltage value of the reference voltage Vref, which is a gate input, to set the current flowing to the transistor P2 to the maximum current. In the present embodiment, the reference voltage Vref is set so that the maximum current flowing to the transistor P2 becomes 20 µA.

Further, the slowly cooling circuit 202 is a circuit to gradually lower the temperature of the phase-change element by controlling the current flowing to the phase-change element of a memory cell. The slowly cooling circuit 202 is constituted from transistors P3, P4, P5, P6W, P7, P8W, transistors N9, N10, and a comparator circuit 102. Drain, source and gate of the transistor P3 are respectively connected to a source of the transistor P4, a power supply Vdd, and a junction Vpg. Drain, source and gate of the transistor P4 are respectively connected to a connection node Vbit, a drain of the transistor P3, and the output from the comparator circuit 102. The connection node Vbit and the clamp voltage Vclmp are inputted to the comparator circuit 102, and the comparator circuit 102 outputs a comparison result to the gate of the transistor P4.

Drain, source and gate of the transistor P5 are respectively connected to a source of the transistor P6W, the power supply Vdd, and a slow-cooling control signal RS1. Drain, source and gate of the transistor P6W are respectively connected to the junction Vpg, the drain of the transistor P5, and the slow-cooling control signal RS1. Drain, source and gate of the transistor P7 are respectively connected to a source of the transistor P8W, a power supply Vdd, and a slow-cooling control signal RS2. Drain, source and gate of the transistor P8W are respectively connected to the junction Vpg, the drain of the transistor P7, and the junction Vpg.

Drain, source and gate of the transistor N9 are respectively connected to the junction Vpg, GND, and the slow-cooling control signal RS2. Drain, source and gate of the transistor N10 are respectively connected to the connection node Vbit, GND, and a write/read control signal WRS. A circuit section constituted from the transistors P3, P4 constitutes a slowly cooling bypass circuit in the slowly cooling circuit 202. The slow-cooling control signals RS1, RS2 cause the connection node Vbit to be driven to control the voltage and current thereof. Further, the transistors P6W, P8W are transistors whose drive capability is made smaller than that of a general transistor. They indicate a transistor whose channel length is made thick or some transistors connected in serial.

The slowly cooling circuit 202 supplies voltage and current to the connection node Vbit by means of the transistors P3, P4 connected between the power supply Vdd and the connection node Vbit. The slowly cooling circuit is set so that the current flowing thereto becomes smaller during the operation by supplying voltage of 0.8V and current of 180 μA (in the case where the junction Vpg is set to GND) to the connection node Vbit to raise voltage of the junction Vpg. In other words, the current flowing to the connection node Vbit can be varied. Thus, the current from the sense amplifier 201 and the slowly cooling circuit 202 flows to the phase-change element at readout. The current from the slowly cooling circuit 202 is made smaller, whereby the phase-change element is slowly cooled.

The Y switch 203 is constituted from a plurality of transistors N3 to N4. The number of the plurality of transistors in the Y switch corresponds to that of Y selection signals Y0 to Yn. In each transistor in the Y switch 203, a drain is connected to the connection node Vbit; a gate is connected to the corresponding Y selection signal (Y0 to Yn); and a source is connected to a bit line of the corresponding memory cell. The Y switch 203 connects the bit line of the memory cell selected by the Y selection signal to the connection node Vbit, which becomes an input of the sense amplifier 201.

The reference amplifier 204 monitors a readout current equivalent to that for the memory cell to output a reference amplifier output Vra as a reference output. The sense amplifier output Vsa and the reference amplifier output Vra are inputted to the latch amplifier circuit 205, and the latch amplifier circuit 205 compares and determines the both outputs to amplify and hold the fixed data. After fixing the data, the sense amplifier output Vsa is cut off.

Next, the readout operation of the present embodiment will be described with reference to FIGS. 11 to 14. The phase-change memory of the present invention is characterized that dynamic resistance is read out during readout at a set state. The phase-change memory of the present invention is programmed by means of a small reset program current. For that reason, transition voltage Vth of the phase-change element is set so as to be high voltage. It is thought that this transition voltage Vth is caused by electric field intensity applied to the phase-change element GST. For example, by causing the film thickness of the phase-change element GST to be thick, the electric field intensity can be set to higher. Thus, by causing the transition voltage to become higher, the readout voltage at the readout can be heightened.

The readout voltage is set to higher than the hold voltage VH, and the current flowing to the phase-change element at a dynamic state is read out, whereby fast readout can be carried out. On the other hand, in the case where the readout voltage is heightened, there is a fear that the phase-change element is accidentally programmed to a reset state. Thus, in the readout at the set state, the phase-change element is restored to the set state by means of the slowly cooling circuit.

When the phase-change element is in a standby state before starting the readout operation, the signal STB becomes a High level and the sense amplifier output Vsa becomes a Low level, that is, they become an initial state. On the other hand, the slow-cooling control signals RS1 and RS2 become a Low level, the write/read control signal WRS becomes a High level, and this causes the connection node Vbit to be initialized to a Low level. A desired constant voltage has already applied to each of the reference voltage Vref and the clamp voltage Vclmp.

When the readout is started, for example, the Y selection signal Y0 is changed to a High level, whereby one bit line is selected. The standby signal STB and the write/read control signal WRS are changed from a High level to a Low level, whereby the sense amplifier 201 is activated. Further, in the slowly cooling circuit 202, the slow-cooling control signals RS1 and RS2 are changed from a Low level to a High level.

In the sense amplifier 201, the transistors P1, P2 and N1 conduct an electric current therethrough to supply voltage to the connection node Vbit. Voltage of 0.8V and current of 20 μA are supplied to this connection node Vbit. Moreover, in the slowly cooling circuit 202, the transistor N9 conducts an electric current therethrough in response to the slow-cooling control signal RS2, and the junction Vpg is lowered to a Low (0V) level. The transistors P3, P4 conduct an electric current therethrough, and current of 180 μA is thus supplied to the connection node Vbit. Voltage of 0.8V is applied to the bit line of the selected memory cell as the readout voltage Vread. Therefore, voltage of 0.8V and current of 20 μA are supplied to the connection node Vbit.

Now, it is assumed that the phase-change element GST is programmed to a set state in accordance with FIG. 14. The readout voltage Vread is applied to the phase-change element GST, whereby a set readout current Iread flows in the phase-change element GST through dynamic resistance Rdyn. Here, the readout voltage Vread is applied to the phase-change element GST whose transition voltage Vth is set to higher as voltage higher than the hold voltage VH as shown in FIG. 14. The hold voltage VH is voltage in which a resistance value is changed from a set resistance value to a dynamic resistance value in the case where applied voltage to the phase-change element is increased. Thus, the readout voltage Vread is set so as to meet a formula (3).

$$VH < V\text{read} < V\text{th (min)} \hspace{4em} \text{Formula (3)}$$

For example, even in the case where the set resistance Rset is now about 100 KΩ, the dynamic resistance Rdyn is about one twentieth (1/20) times thereof, that is, about 5 KΩ. Voltage of 0.8V is applied to the connection node Vbit as the readout voltage Vread. In the case where drain-source voltage Vds of a memory cell selecting transistor is set to 0.4V, a current of 200 μA can flow as shown in FIG. 12. This is the same current value as the minimum reset program current Ireset(min). Thus, compared with the case of actual resistance of 100 KΩ, it is possible to ensure about 20 times of set readout current. The data on the memory cell are amplified, and the sense amplifier output Vsa reaches desired bias.

Moreover, the latch amplifier circuit 205 compares and determines the sense amplifier output Vsa with the reference amplifier output Vra. At the same time when the data are fixed and then held, the sense amplifier output Vsa is cut off. Subsequently, the slow-cooling control signal RS2 is changed from a High level to a Low level. The transistor N9 does not conduct an electric current, and as shown in FIG. 11, the junction Vpa starts to rise slowly by means of a transistor line constituted from the transistors P7 and P8W. Thus, the current flowing to the transistor P3 becomes smaller, and the connection node Vbit also starts to drop slowly along with it. The current flowing to the phase-change element GST becomes smaller, and the applied voltage is also lowered.

Then, the slow-cooling control signal RS1 is further changed from a High level to a Low level. The transistors P5, P6W conduct an electric current, and the junction Vpg is further caused to rise. The junction Vpg then rises to the power supply Vdd level. No current flows to the transistor P3. In accordance with this, the voltage VGST applied to the phase-change element is further lowered from midpoint potential to be held to Gnd level.

FIG. 12 shows a current waveform during the readout operation described above. In a readout period of time, a set readout current of 200 µA flows. In a slowly cooling period of time, the current gradually reduces with a profile similar to that of a time-varying waveform of the voltage VGST applied to the phase-change element. Thus, in the case of the readout at the set state, the set readout current is a large current equivalent to the reset program current, and the phase-change element melts once. However, by slowly cooling thereafter, the phase-change element GST can recrystallize to return (or restore) to the set state.

Although the readout current at the set state is set to a large current equivalent to the minimum reset program current in FIG. 12 and FIG. 14, it can be set to a current required for minimum fast readout. The current required for the fast readout is generally in the range of 20 to 50 µA, and the set readout current can be set to the range of 20 to 50 µA. For example, in the case where parasitic capacitance of the bit line is 0.5 pf and the set readout current is 40 µA, fast readout of about 10 to 20 ns can be achieved. The set readout current can be set to a current required for a desired readout period of time. Even in such a case, the readout voltage Vread is set to voltage higher than the hold voltage but lower than the transition voltage Vth(min). Thus, it is preferable that the slowly cooling circuit 202 is provided because the phase-change element is read out in a dynamic resistance region.

Next, the case of the state where the phase-change element GST is programmed at a reset state will be described as shown in FIG. 13. Voltage of 0.8V is applied to the phase-change element as readout voltage Vread. The phase-change element has high resistance because of the reset state, and a current thus hardly flows thereto. Since the readout voltage Vread is set to transition voltage Vth(min) or less, no OTS occurs. Thus, reset readout current Iread becomes very small, and the phase-change element does not become high temperature to be melted. For that reason, even when the slowly cooling circuit operates in the same manner as the set readout, no current flows to the phase-change element GST. Therefore, no read disturb occurs and the phase-change element GST is not rewritten from the reset state to the set state.

Here, the system in which the slowly cooling operation is carried out after the readout operation is generated in spite of the reset state or set state has been described. However, by confirming the data that have been read out once and held, and carrying out feedback control to the slowly cooling circuit, it is possible not to operate the slowly cooling circuit at the reset state.

In the present embodiment, the transition voltage Vth of the phase-change element is heightened, and the readout voltage Vread is set to voltage higher than the hold voltage VH. The readout at a set state is made by means of the set readout current of not a set resistance value but a dynamic resistance value. In the case where the program current is small, the set resistance becomes high. This makes it impossible to hold the set readout current required for fast readout. However, the readout voltage is heightened at the readout to be set to the dynamic resistance, whereby fast readout can be carried out. Further, in order to prevent read disturb to a reset state, the current flowing to the phase-change element is gradually reduced after readout to restore the phase-change element to a set state. A phase-change memory cell having a small program current and a large set readout current is thus obtained.

Second Embodiment

Figure 15:
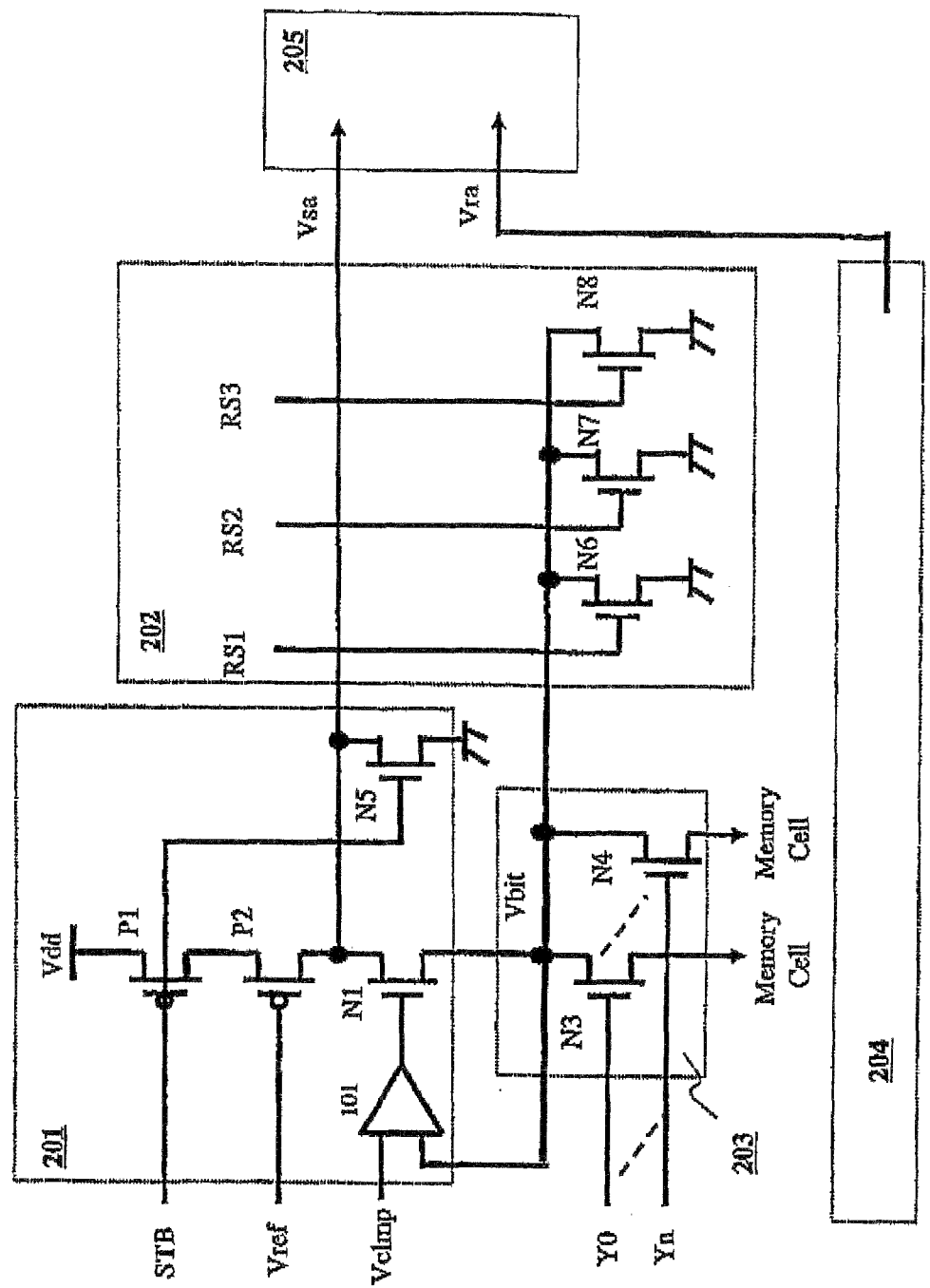
FIG. 15 is a circuit diagram of a readout circuit according to a second embodiment of the present invention.
Figure 16:
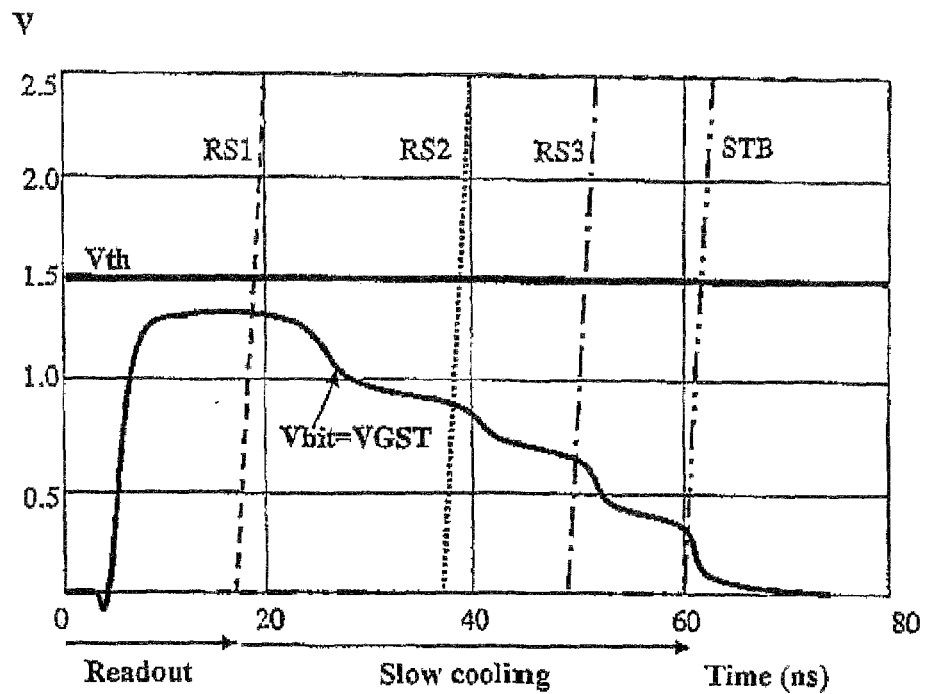
FIG. 16 is a waveform diagram of operating voltage in the readout circuit of FIG. 15.
Figure 17:
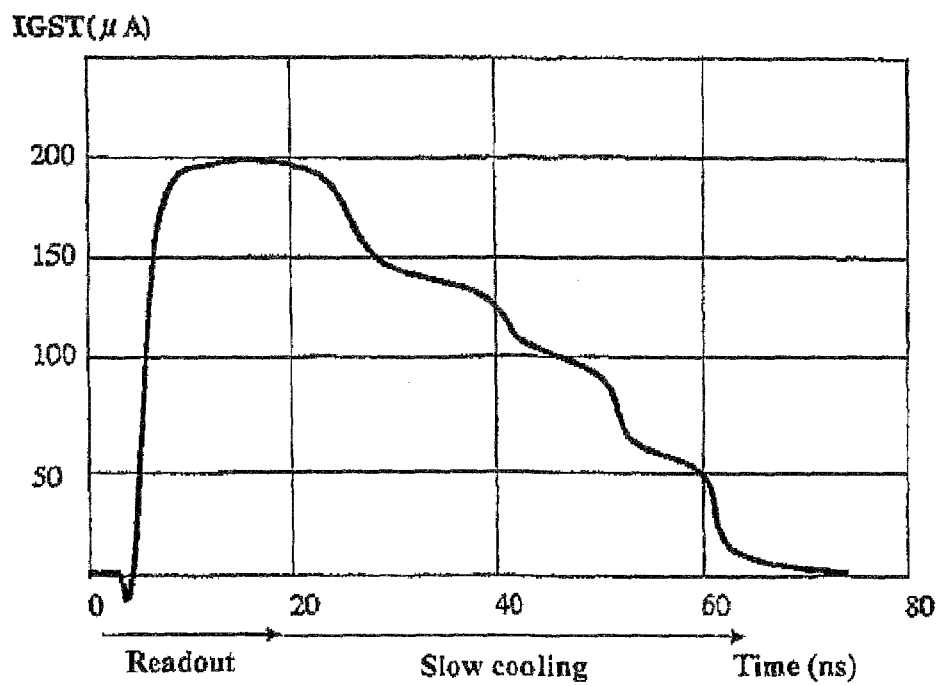
FIG. 17 is a waveform diagram of an operating current in the readout circuit of FIG. 15.

A readout circuit according to a second embodiment of the present invention will be described in detail with reference to FIGS. 15 to 17. The present embodiment is an embodiment providing a second circuit configuration of the readout circuit in which the slowly cooling circuit 202 in the readout circuit of the first embodiment is changed. FIG. 15 shows a block diagram of a second readout circuit. FIG. 16 and FIG. 17 respectively show waveform diagrams of operating voltage and current are respectively.

The readout circuit is constituted from a sense amplifier 201, a slowly cooling circuit 202, a Y switch 203, a reference amplifier 204, and a latch amplifier circuit 205. In this configuration, the sense amplifier 201, the Y switch 203, the reference amplifier 204, and the latch amplifier circuit 205 respectively have same configurations as those in the first embodiment. Parts of the same configuration will briefly be described.

The sense amplifier 201 is the same as the circuit shown in FIG. 9. The sense amplifier 201 is constituted from transistors P1, P2, N1, and N5, and a comparator circuit 101. The transistor P1 to which a standby signal STB is inputted as a gate input, and the transistor P2 to which reference voltage Vref is inputted as a gate input are connected in series. Voltage of a connection node Vbit and clamp voltage Vclmp are inputted to the comparator circuit 101, and an output from the comparator circuit 101 is a gate input of the transistor N1. A source of the transistor N1 is connected to a drain of the transistor P2 to become sense amplifier output Vsa. In the present embodiment, clamp voltage Vclmp is set to 1.3V, and the maximum current flowing to the transistor P2 is set to 200 µA.

In the transistor N5, a standby signal STB is a gate input. Drain and source of the transistor N5 are respectively connected to the sense amplifier output Vsa and GND. The connection node Vbit is connected to the Y switch 203. The Y switch 203 selects a bit line connected to a memory cell. The sense amplifier output Vsa and reference amplifier output Vra are inputted to the latch amplifier circuit 205. The latch amplifier circuit 205 compares and amplifies them to determine the data, and then holds the data. Further, the slowly cooling circuit 202 is constituted from the transistors N6, N7, and N8. Drain and source of each transistor are respectively connected to the connection node Vbit and GND. Slow-cooling control signals RS1, RS2, and RS3 are respectively inputted to gates of the transistors N6, N7 and N8.

Next, the operation thereof will be described. FIG. 16 shows operation timing and a waveform diagram of inner voltage of the sense amplifier according to the second embodiment. FIG. 17 represents operation timing of the sense amplifier and a current IGST flowing to the phase-change element GST.

In a standby state before the readout operation is started, a strobe signal STB and a sense amplifier output Vsa are respectively initialized to a High level and a Low level. On the other hand, the low-cooling control signals RS1, RS2 and RS3 are set to a High level, and the connection node Vbit is initialized to a Low level. Desired constant voltage has already been applied to each of the reference voltage Vref and the clamp voltage Vclmp.

When the readout is started, for example, the Y selection signal Y0 is changed to a High level to select one bit line. The strobe signal STB is changed from a High level to a Low level, whereby the sense amplifier is activated. Further, similarly, in the slowly cooling circuit 202, the slow-cooling control signals RS1, RS2 and RS3 are changed from a High level to a Low level. Bias voltage through the transistor P1, P2 and N1 of the sense amplifier 201 is applied to the connection node Vbit, and the bias voltage is applied to the bit line as readout voltage Vread. Here, with respect to the phase-change element GST whose transition voltage Vth is set to higher, the readout voltage Vread is voltage higher than the hold voltage VH but lower than transition voltage Vth(min). Here, when the clamp voltage Vclmp is set to 1.3V the readout voltage Vread is set to 1.3V.

The phase-change element GST is now programmed to a set state. When the readout voltage Vread is applied to the phase-change element GST, a set current Iread flows through dynamic resistance Rdyn. For example, it is now assumed that even in the case where set resistance Rset is about 100 KΩ, the dynamic resistance Rdyn is about 4.5 KΩ. Readout voltage of 1.3V is applied to the connection node Vbit. In the case where drain-source voltage Vds of the memory cell selecting transistor is 0.4V, a current of 200 μA can flow as shown in FIG. 17. The set readout current Iread has the same current value as the minimum reset program current Ireset (min). Thus, compared with the case of actual resistance of 100 KΩ, it is possible to ensure about 20 times current.

In a readout period of time, after data are compared and amplified in the latch amplifier circuit to determine the data, at the same time of holding the data, the sense amplifier output Vsa is cut off. Subsequently, when the slow-cooling control signal RS1 is changed from a Low level to a High level, the transistor N6 conducts an electric current therethrough. When the transistor N6 conducts an electric current therethrough, a current from the sense amplifier 201 is shunted, whereby the connection node Vbit is drawn toward the Gnd level. This level can be determined on the basis of a ratio of capability of the transistors P1, P2 and N1 to capability of the transistor N6. Moreover, the slow-cooling control signal RS2 and RS3 are in turn changed from a Low level to a High level, the connection node Vbit is further drawn (or reduced) toward ground potential Gnd.

Finally, the signal STB becomes a High level to be a standby state, and the connection node Vbit then becomes the Gnd level. Thus, the transistors N6, N7 and N8 of the slowly cooling circuit in turn conduct an electric current therethrough, and the current from the sense amplifier is shunted, whereby the level of the connection node Vbit is gradually reduced. The transistors N6, N7 and N8 of the slowly cooling circuit in turn conduct an electric current therethrough, impedance between the connection node and the GND is changed and adjusted, whereby the current flowing to the phase-change element is reduced. In the present embodiment, three control signals are mentioned as the slow-cooling control signals RS1 to RS3. In order to control the slowly cooling operation in detail, the number of slow-cooling control signals and/or the number of NMOS transistors may be increased.

As shown in FIG. 16 and FIG. 17, the maximum readout voltage is applied to the phase-change element in the readout period of time, and the maximum set readout current flows thereto. In the slowly cooling period of time, the set readout current gradually reduces with a profile similar to that of a time-varying waveform of the voltage VGST applied to the phase-change element. Thus, in the case of the readout at the set state, the set readout current is a large current equivalent to the reset program current, and the phase-change element melts once. However, by slowly cooling thereafter, the phase-change element GST can recrystallize to return to the set state.

In the present embodiment, the readout current at the set state is set to a current equivalent to the reset program current. However, the set readout current value can be set to a small current value in the range of 20 to 50 μA required for minimum fast readout.

Next, the case of the state where the phase-change element GST is programmed to the reset state will be described. The readout voltage Vread applied to the phase-change element GST is 1.3V and is the transition voltage Vth(min) or less, whereby no OTS occurs. The resistance of the phase-change element is 10,000 KΩ, for example, and the reset readout current Iread becomes 0.1 μA. The reset readout current read is outputted from the sense amplifier as a sense amplifier output Vsa. During the readout period of time, data are determined by the latch amplifier circuit to latch the data.

In the slowly cooling period of time, the current from the sense amplifier is shunted to the transistor of the slowly cooling circuit in the same manner as that at the set state. However, since the reset readout current Iread is very small, the phase-change element hardly becomes high temperature to be melted. Even when the slowly cooling circuit operates in the same manner as the set readout, the current to the phase-change element GST is further shunted. For that reason, no read disturb occurs, and the phase-change element GST is not rewritten from the reset state to the set state.

In the slowly cooling circuit of the present embodiment, the current flowing to the phase-change element is gradually reduced by shunting the current from the sense amplifier at a common junction. By constructing in this manner, it is possible to achieve the effect similar to that in the first embodiment, and a phase-change memory cell in which a program current is small and a set readout current is large can be obtained.

Third Embodiment

Figure 18:
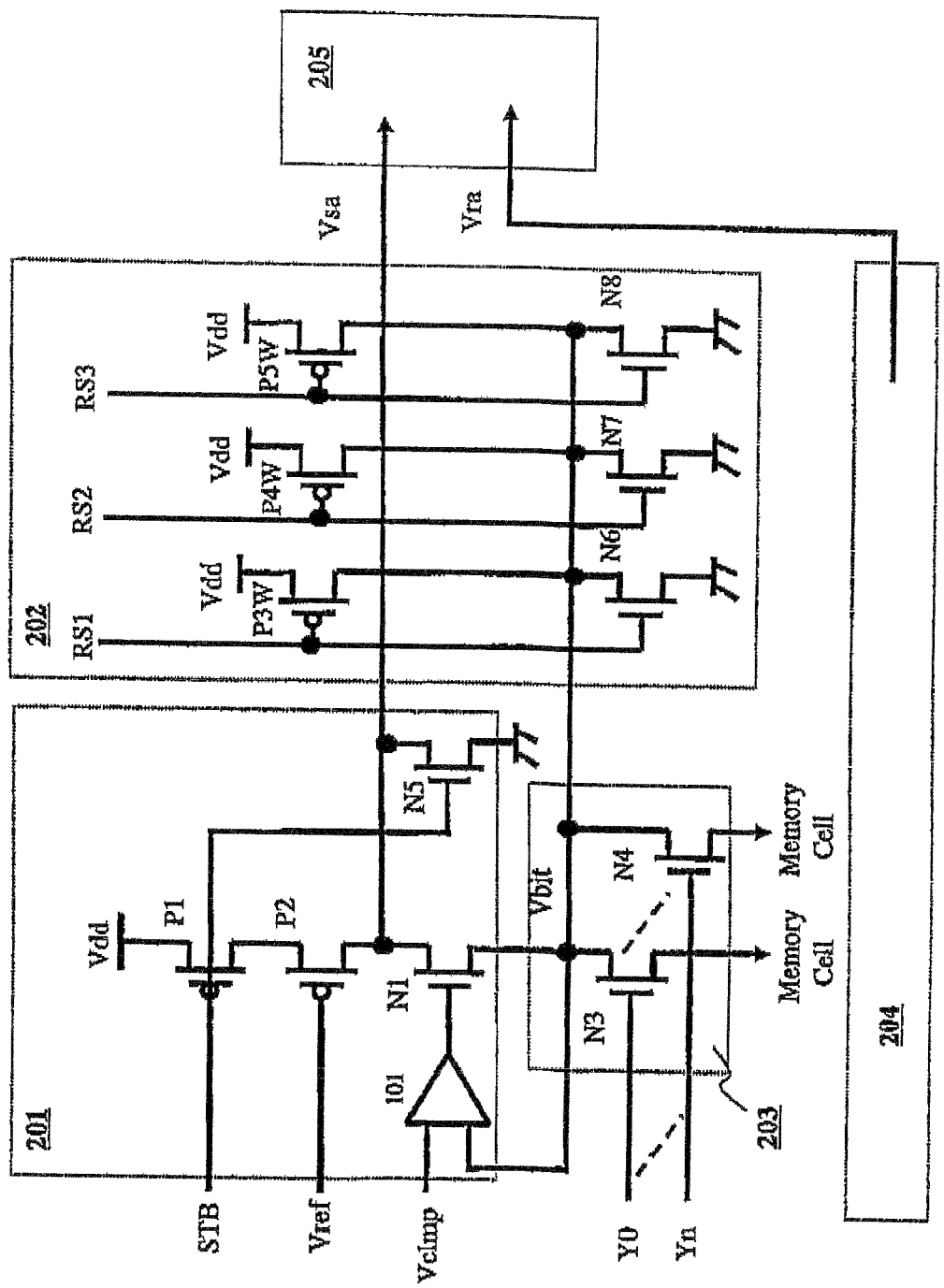
FIG. 18 is a circuit diagram of a readout circuit according to a third embodiment of the present invention.

A readout circuit according to a third embodiment of the present invention will be described in detail with reference to FIG. 18. The present embodiment is an embodiment providing a third circuit configuration of the readout circuit in which the slowly cooling circuit 202 in the readout circuit is changed. FIG. 18 shows a block diagram of a third readout circuit.

The readout circuit is constituted from a sense amplifier 201, a slowly cooling circuit 202, a Y switch 203, a reference amplifier 204, and a latch amplifier circuit 205. In this configuration, the sense amplifier 201, the Y switch 203, the reference amplifier 204, and the latch amplifier circuit 205 respectively have same configurations as those in the first embodiment. Parts of the same configuration will briefly be described.

The sense amplifier 201 is the same as the circuit shown in FIG. 9. The sense amplifier 201 is constituted from transistors P1, P2, N1, and N5, and a comparator circuit 101. The transistor P1 to which a standby signal STB is inputted as a gate input, and the transistor P2 to which reference voltage Vref is inputted as a gate input are connected in series. Voltage of a connection node Vbit and clamp voltage Vclmp are inputted to the comparator circuit 101, and an output from the comparator circuit 101 is a gate input of the transistor N1. A source of the transistor N1 is connected to a drain of the transistor P2 to become sense amplifier output Vsa. In the present embodiment, clamp voltage Vclmp is set to 1.3V, and the maximum current flowing to the transistor P2 is set to 200 µA.

In the transistor N5, a standby signal STB is a gate input. Drain and source of the transistor N5 are respectively connected to the sense amplifier output Vsa and GND. The connection node Vbit is connected to the Y switch 203. The Y switch 203 selects a bit line connected to a memory cell. The sense amplifier output Vsa and reference amplifier output Vra are inputted to the latch amplifier circuit 205. The latch amplifier circuit 205 compares and amplifies them to determine the data, and then holds the data.

Further, the third slowly cooling circuit 202 is constituted from three inverter circuits in which the slow-cooling control signals RS1, RS2 and RS3 are respectively inputs thereof and the outputs are commonly connected to the connection node Vbit. The respective inverter circuits are three inverter circuits respectively constituted from the transistor P3W and the transistor N6, the transistor P4W and the transistor N7, and the transistor P5W and the transistor N8, which are connected between the power supply Vdd and the Gnd. Current drive capability of load transistors P3W, P4W and P5W of the respective inverter circuits is set to very small. For example, by connecting some transistors in serial or making a channel length of each transistor longer, it is possible to make the current drive capability smaller.

The operation in the third embodiment is similar to the basic operation in the second embodiment. As for a different operation, bias of the connection node Vbit is applied not only from the sense amplifier 201 but also from the load transistors P3W, P4W and P5W of the inverter circuits. However, since the current drive capability of the load transistors P3W, P4W and P5W is very small, the current from each of the load transistor is negligible smaller than the current from the sense amplifier 201.

As an initial setup before the readout, the slow-cooling control signals RS1, RS2 and RS3 are in a High level, and the connection node Vbit is set to a Low level. When the readout operation is started, the slow-cooling control signals RS1, RS2 and RS3 are changed to a Low level. The drive transistors N6, N7 and N8 of the inverter circuits do not conduct an electric current, while the load transistors P3W, P4W and P5W thereof conduct an electric current therethrough. For that reason, bias from the slowly cooling circuit is added to bias from the sense amplifier. However, since the capability of the load transistor is made smaller, it basically becomes the same bias setup as that from the sense amplifier. Therefore, since the operation in the third embodiment is the same as the operation in the second embodiment, the description thereof is omitted.

In the slowly cooling circuit of the present embodiment, the current flowing to the phase-change element is gradually reduced by shunting the current from the sense amplifier at the connection node in the same manner as that in the second embodiment. By constructing in this manner, it is possible to achieve the effect similar to that in the first embodiment, and a phase-change memory cell in which a program current is small and a set readout current is large can be obtained.

According to the phase-change memory readout circuit of the present invention, it is possible to program a phase-change element with a small reset program current. In the case where the phase-change element is programmed with a small reset program current, set resistance Rset and reset resistance Rreset become larger. Thus, the readout voltage is set to voltage equal to or higher than the hold voltage, and the phase-change element is set to a dynamic state at the set readout, whereby the set readout current becomes larger. Moreover, in order to prevent read disturb at a reset state, the current flowing to the phase-change element is gradually reduced after the readout to restore the phase-change element to a set state. A phase-change memory cell having a small program current and a large set readout current is thus obtained. Further, a phase-change memory device capable of fast readout is obtained.

As described above, although the present invention has specifically been described in conjunction with some embodiments thereof, it should be understood that the present invention is not limited to the above-described embodiments, but various modification may be applied to the present invention without departing from the scope and spirit of the present invention, and such modifications are to be included within the present invention.

What is claimed is:

1. A memory readout circuit for use in a phase-change memory device comprising phase-change elements as memory cells, the memory readout circuit comprising a column selecting switch and a sense amplifier, wherein the sense amplifier sets readout voltage, which is applied to a selected phase-change element selected among the phase-change elements by the column selecting switch, to voltage equal to or higher than hold voltage of the selected phase-change element but lower than transition voltage of the selected phase-change element in a readout cycle, and the selected phase-change element is read out as a dynamic state in the case where the selected phase-change element is in a set state, and wherein a set readout current flowing to the selected phase-change element at said dynamic state is equal to or less than a minimum reset program current and is read out.

2. The memory readout circuit as claimed in claim 1, further comprising:
a slowly cooling circuit connected to a connection node between the column selecting switch and the sense amplifier,
wherein after latching data read out from the selected phase-change element, the slowly cooling circuit causes a current flowing to the selected phase-change element to be reduced to slowly cool the selected phase-change element, whereby the selected phase-change element is restored to the set state.

3. The memory readout circuit as claimed in claim 2, wherein the slowly cooling circuit changes impedance between the connection node and a power supply in response to a slow-cooling control signal to cause a current flowing to the selected phase-change element to be reduced.

4. The memory readout circuit as claimed in claim 3, wherein the slowly cooling circuit is constituted from first and second transistors and a comparator circuit, the first and second transistors being connected in series between the connection node and the power supply, and
wherein the first transistor controls a flowing current by means of the slow-cooling signal, and voltage of the connection node and clamp voltage are inputted into the comparator circuit and an output from the comparator circuit is used as a gate input of the second transistor to control the voltage of the connection node.

5. The memory readout circuit as claimed in claim 2, wherein the slowly cooling circuit changes impedance between the connection node and ground voltage in response to a slow-cooling control signal to cause a current flowing to the selected phase-change element to be reduced.

6. The memory readout circuit as claimed in claim 5, wherein the slowly cooling circuit is constituted from a transistor, and
wherein in the transistor, a drain is connected to the connection node; a source is connected to the ground voltage; and the transistor conducts an electric current in response to the slow-cooling control signal inputted to a gate thereof.

7. The memory readout circuit as claimed in claim 5, wherein the slowly cooling circuit is constituted from an inverter circuit, and the inverter circuit comprises a load transistor and a drive transistor, and
wherein an output from the inverter circuit is connected to the connection node, and the drive transistor of the inverter circuit conducts an electric current in response to the inputted slow-cooling control signal.

8. A phase-change memory device comprising phase-change elements as memory cells and a memory readout circuit, the memory readout circuit comprising a column selecting switch and a sense amplifier, wherein the sense amplifier sets readout voltage, which is applied to a selected phase-change element selected among the phase-change elements by the column selecting switch, to voltage equal to or higher than hold voltage of the selected phase-change element but lower than transition voltage of the selected phase-change element in a readout cycle, and the selected phase-change element is read out as a dynamic state in the case where the selected phase-change element is in a set state, and wherein a set readout current flowing to the selected phase-change element at said dynamic state is equal to or less than a minimum reset program current.

9. The phase-change memory device as claimed in claim 8, further comprising:
a latch amplifier circuit; and
a slowly cooling circuit connected to a connection node between the column selecting switch and the sense amplifier,
wherein the phase-change memory device has a slowly cooling period of time in which:
the sense amplifier reads out data from the selected phase-change element in the readout period of time;
the latch amplifier circuit latches the data; and
the slowly cooling circuit then causes a current flowing to the selected phase-change element to be reduced to slowly cool the selected phase-change element, whereby the selected phase-change element is restored to the set state.

10. The phase-change memory device as claimed in claim 9, wherein in the slowly cooling period of time, a supply current from the slowly cooling circuit is caused to be reduced in response to a slow-cooling control signal to cause a current flowing to the selected phase-change element to be reduced.

11. The phase-change memory device as claimed in claim 9, wherein in the slowly cooling period of time, a current shunted to the slowly cooling circuit is caused to be increased in response to a slow-cooling control signal to cause a current flowing to the selected phase-change element to be reduced.

12. A phase-change memory device comprising phase-change elements as memory cells and a memory readout circuit, the memory readout circuit comprising a column selecting switch and a sense amplifier which comprises a bias circuit for controlling voltage and a current on bit lines in the phase-change elements, wherein the bias circuit of the sense amplifier sets readout voltage, which is applied to a selected phase-change element selected among the phase-change elements by the column selecting switch, to voltage equal to or higher than hold voltage of the selected phase-change element but lower than transition voltage of the selected phase-change element in a readout cycle, and the selected phase-change element is read out as a dynamic state in the case where the selected phase-change element is in a set state, and wherein a set readout current flowing to the selected phase-change element at said dynamic state is controlled to be equal to or less than a minimum reset program current and is read out.

13. The phase-change memory device as claimed in claim 12, wherein the memory readout circuit further comprises:
a slowly cooling circuit connected to a connection node between the column selecting switch and the sense amplifier,
wherein after latching data read out from the selected phase-change element, the slowly cooling circuit causes a current flowing to the selected phase-change element to be reduced to slowly cool the selected phase-change element, whereby the selected phase-change element is restored to the set state.

14. The phase-change memory device as claimed in claim 13, wherein the slowly cooling circuit changes impedance between the connection node and a power supply in response to a slow-cooling control signal to cause a current flowing to the selected phase-change element to be reduced.

15. The phase-change memory device as claimed in claim 14, wherein the slowly cooling circuit is constituted from first and second transistors and a comparator circuit, the first and second transistors being connected in series between the connection node and the power supply, and
wherein the first transistor controls a flowing current by means of the slow-cooling signal, and voltage of the connection node and clamp voltage are inputted into the comparator circuit and an output from the comparator circuit is used as a gate input of the second transistor to control the voltage of the connection node.

16. The phase-change memory device as claimed in claim 13, wherein the slowly cooling circuit changes impedance between the connection node and ground voltage in response to a slow-cooling control signal to cause a current flowing to the selected phase-change element to be reduced.

17. The phase-change memory device as claimed in claim 16, wherein the slowly cooling circuit is constituted from a transistor, and
wherein in the transistor, a drain is connected to the connection node; a source is connected to the ground voltage; and the transistor conducts an electric current in response to the slow-cooling control signal inputted to a gate thereof.

18. The phase-change memory device as claimed in claim 16, wherein the slowly cooling circuit is constituted from an inverter circuit, and the inverter circuit comprises a load transistor and a drive transistor, and
wherein an output from the inverter circuit is connected to the connection node, and the drive transistor of the inverter circuit conducts an electric current in response to the inputted slow-cooling control signal.

\* \* \* \* \*